United States Patent
Andersen et al.

(10) Patent No.: US 7,425,853 B2
(45) Date of Patent: Sep. 16, 2008

(54) SYSTEMS AND METHODS FOR PULSE WIDTH MODULATING ASYMMETRIC SIGNAL LEVELS

(75) Inventors: Jack B. Andersen, Cedar Park, TX (US); Michael A. Kost, Cedar Park, TX (US)

(73) Assignee: D2Audio Corporation, Austin, TX (US)

( * ) Notice: Subject to any disclaimer, the term of this patent is extended or adjusted under 35 U.S.C. 154(b) by 15 days.

(21) Appl. No.: 11/669,643

(22) Filed: Jan. 31, 2007

(65) Prior Publication Data

US 2007/0176660 A1 Aug. 2, 2007

Related U.S. Application Data

(60) Provisional application No. 60/763,614, filed on Jan. 31, 2006.

(51) Int. Cl.
*H03K 3/017* (2006.01)
(52) U.S. Cl. .................. 327/172; 332/109; 375/238
(58) Field of Classification Search .................. None
See application file for complete search history.

(56) References Cited

U.S. PATENT DOCUMENTS

| | | | | |
|---|---|---|---|---|
| 5,548,286 A | * | 8/1996 | Craven | 341/126 |
| 5,990,751 A | * | 11/1999 | Takita | 330/297 |
| 6,762,704 B1 | * | 7/2004 | Melanson et al. | 341/143 |
| 6,812,785 B2 | | 11/2004 | Masuda et al. | |
| 6,967,607 B2 | | 11/2005 | Melanson | |
| 7,061,312 B2 | * | 6/2006 | Andersen et al. | 330/10 |
| 7,286,009 B2 | * | 10/2007 | Andersen et al. | 330/10 |
| 7,286,010 B2 | * | 10/2007 | Chieng et al. | 330/10 |
| 7,307,557 B2 | * | 12/2007 | Wegner et al. | 341/76 |
| 7,342,986 B2 | * | 3/2008 | Nakamura et al. | 375/376 |
| 2004/0212524 A1 | | 10/2004 | Komarura | |
| 2004/0239417 A1 | | 12/2004 | Kowkutia | |
| 2005/0151584 A1 | | 7/2005 | Sawashi | |

* cited by examiner

*Primary Examiner*—Cassandra Cox
(74) *Attorney, Agent, or Firm*—Law Offices of Mark L. Berrier

(57) ABSTRACT

Systems and methods for pulse width modulating waveforms to represent asymmetric signal levels using pulses that are symmetric within their respective switching periods. One embodiment comprises a pulse width modulation system including an asymmetric correction unit and a pair of modulators. The asymmetric correction unit receives samples of an input signal and produces two separate output signals for corresponding modulators. For each sample, the asymmetric correction unit determines whether the signal level of the sample is symmetric or asymmetric. If the signal level of the sample is symmetric, the sample is forwarded to each of the modulators. If the signal level is asymmetric, the asymmetric correction unit increases one modified sample to the next higher symmetric signal level and decreases another modified sample to the next lower symmetric signal level and forwards the modified samples to the modulators.

20 Claims, 4 Drawing Sheets

SYSTEMS AND METHODS FOR PULSE WIDTH MODULATING ASYMMETRIC SIGNAL LEVELS

RELATED APPLICATIONS

This application claims the benefit of U.S. Provisional Patent Application 60/763,614, filed Jan. 31, 2006, which is incorporated by reference as if set forth herein in its entirety.

BACKGROUND

1. Field of the Invention

The invention relates generally to systems and methods for signal modulation, and more particularly to systems and methods for pulse width modulating waveforms to represent asymmetric signal levels using pulses that are symmetric within their respective switching periods.

2. Related Art

In a typical pulse width modulation (PWM) amplifier, a digital audio signal (typically encoded in a pulse code modulation, or PCM, format) is processed and modulated to produce a PWM signal which is then used to drive an output stage which produces an analog output signal. Part of the processing that is typically performed on the PCM signal is a quantization of the signal to reduce the number of possible signal levels to a number which can be represented in the PWM modulation scheme used in the amplifier. For example, a 24-bit signal may be quantized to a 10-bit signal.

The number of signal levels that can be represented in a PWM signal is determined by the number of discrete steps, or levels, in a single PWM switch period. In each PWM switch period, the PWM signal will be high for some number of steps, and low for the remainder of the steps. The width of the pulse is the number of steps during which the signal is high. It is desirable for purposes of processing and correcting the signals in the amplifier to have the pulse (the steps during which the signal is high) centered and symmetric within the switch period. This also causes some difficulties, however, as requiring that the pulses be symmetric effectively eliminates half of the possible pulse widths, since an odd number of steps cannot be symmetrically centered within the PWM switch period (assuming an even number of steps in the period.) If, on the other hand, it is not required that the pulses be centered, there are a greater number of potential pulse widths, but it is difficult to correct for artifacts resulting from the use of asymmetric pulses.

It would therefore be desirable to have a way to represent a greater number of signal levels using the available steps in the PWM switch period, while at the same time maintaining the symmetry of the pulses within the PWM switch periods so the processing of the signals in the amplifier can be simplified.

SUMMARY OF THE INVENTION

One or more of the problems outlined above may be solved by the various embodiments of the invention. Broadly speaking, the invention comprises systems and methods for pulse width modulating waveforms to represent asymmetric signal levels using pulses that are symmetric within their respective switching periods.

One embodiment comprises a pulse width modulation system. The system includes an asymmetric correction unit and a pair of modulators. The asymmetric correction unit receives samples of an input signal and, based on these samples, produces two separate output signals, each of which is provided to a corresponding one of the modulators. For each of the samples in the input signal, the asymmetric correction unit determines whether the signal level of the sample is one of a set of symmetric signal levels (that can be represented by a symmetric PWM pulse) or one of a set of asymmetric signal levels (that cannot be represented by a symmetric PWM pulse). If the signal level of the sample is one of the symmetric signal levels, the sample is forwarded to each of the modulators in the respective output signals. If, on the other hand, the signal level of the sample is one of the asymmetric signal levels, the asymmetric correction unit forwards modified samples to each of the modulators. One of the modified samples will have been raised to a higher signal level that is one of the symmetric levels, while the other modified sample will have been reduced to a lower signal level that is one of the symmetric levels. The modified samples are increased/decreased by the same amount with respect to the signal level of the received sample.

In one embodiment, the larger-pulse-width samples will be forwarded alternately to one modulator and then the other. The alternation may occur with every sample, or only when modified samples are generated. In one embodiment, the PWM system is implemented in a digital amplifier. Each of the modulators generates a pair of PWM output signals that control two power FETs present in a typical half-bridge output stage to produce the appropriate amplified pulse width modulated waveform with the half-bridge output stage. In this embodiment, the pairs of signals are input to corresponding half-bridge output stages in a full-bridge configuration. The output stages are driven by the respective PWM signals to produce analog output signals which are applied across a load such as a loudspeaker. The amplifier may include a noise shaper to quantize and noise-shape the signal provided to the asymmetric correction unit. A non-linear correction unit may also be used to process the input audio signal before the noise shaper in order to correct for some of the artifacts of, e.g., PCM-to-PWM conversion.

Another embodiment comprises a method for pulse width modulation. This method includes receiving samples of an input signal and processing the samples of the input signal to produce different-width symmetric pulses which, in combination, represent asymmetric signal levels. For each sample of the received input signal, it is determined whether the signal level of the sample is one of the symmetric signal levels or one of the asymmetric signal levels. Then, if the signal level is symmetric, the sample is forwarded to each of two modulators. If the signal level of the sample is asymmetric, the sample is modified differently for each of the modulators. For one, the sample is increased to a higher symmetric signal. For the other, the sample is decreased to a lower symmetric signal. The samples forwarded to the modulators can then be used to drive corresponding half-bridge output stages that are configured as a full-bridge. The outputs of the half-bridges can be applied across a load such as a loudspeaker. As described above, the method may include non-linearity correction processing and noise shaping of the input signal. The method may also include alternation of the modified samples so that the wider/narrower pulses corresponding to the modified samples alternate between the two modulators and corresponding half-bridges.

Numerous other embodiments and variations are also possible.

BRIEF DESCRIPTION OF THE DRAWINGS

Other objects and advantages of the invention may become apparent upon reading the following detailed description and upon reference to the accompanying drawings.

Figure 1:
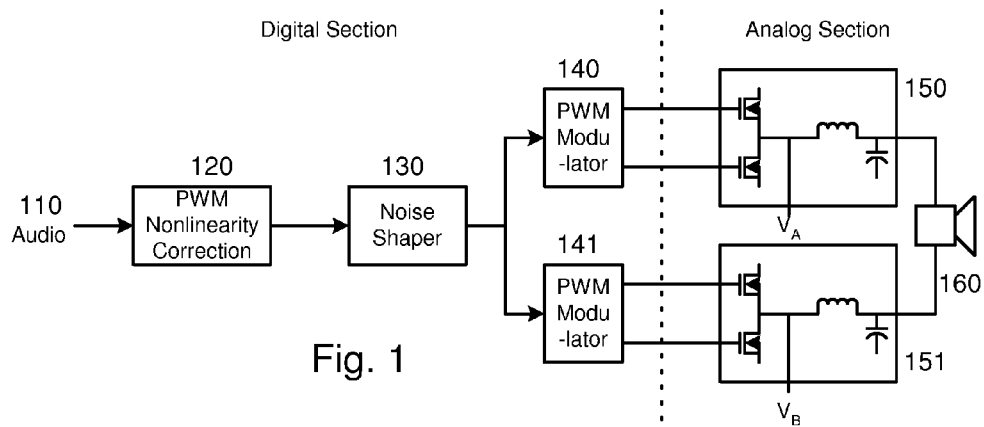
FIG. 1 is a functional block diagram illustrating a digital PWM amplification system using a full-bridge output stage topology.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for modulating the output of a digital switching amplifier.

In one embodiment, a pulse width modulated (PWM) amplifier is configured to receive a pulse code modulated (PCM) audio signal, convert the PCM signal to a PWM signal, and drive an output stage to produce an analog output signal suitable for driving a loudspeaker. The input PCM signal is processed by a non-linear correction unit to pre-correct for artifacts that will be incurred in the process of converting the PCM signal to a PWM signal. After being processed by the non-linear correction unit, the signal is processed by a noise shaper to quantize the signal to a reduced number of bits (signal levels) that can be represented by pulse width modulators in the amplifier. The noise shaper also processes the signal to reduce quantization noise in the audio band.

The output of the noise shaper, rather than being fed directly to a PWM modulator as in a conventional PWM amplifier, is input to an asymmetric correction unit. The asymmetric correction unit generates two signals, each of which is provided to a separate PWM modulator. One of the modulators drives a positive half-bridge output stage, while the other drives a negative half-bridge output stage.

The asymmetric correction unit is configured to determine whether the signal level of each sample in the received signal is a symmetric signal level (one that can be represented by a symmetric PWM pulse.) If the signal level of the sample is a symmetric signal level, the sample is simply forwarded to both of the modulators.

If the signal level of the sample is an asymmetric signal level, the asymmetric correction unit modifies the sample before sending it to the modulators. Moreover, the sample is modified differently for each modulator. For one of the modulators, the signal level of the modified sample is raised to the next higher symmetric signal level. For the other modulator, the modified sample is reduced to the next lower symmetric level. As a result, the PWM waveforms produced by the modulators will not have the same widths in switch periods corresponding to samples with asymmetric signal levels. When the PWM signals are used to drive the corresponding half-bridges of the output stage, the resulting analog output signal has the same average voltage that the asymmetric pulses would have produced, but the symmetry of the pulses enables simpler processing to reduce distortion in the audio signal.

Before describing various exemplary embodiments of the invention, it will be useful to first explain the operation of a conventional PWM amplifier. A typical digital PWM amplifier is shown in FIG. 1. As depicted in the figure, the PWM amplifier system comprises a digital audio signal (110), a PWM nonlinearity correction (120), a noise shaper (130), modulators (140, 141), output stages (150, 151), and a load (160). In normal operation, a digital audio signal is provided to the amplifier. The digital audio signal is typically in a 24-bit, pulse-code modulated (PCM) format and typically supplied at a 512 kHz sampling rate. A PWM nonlinearity correction block applies a pre-correction to the digital audio signal that approximately corrects for the non-linear artifacts created by the PCM to PWM conversion. The pre-corrected digital audio is then noise-shaped in the noise shaper. The noise shaper typically quantizes the 24-bit PCM digital audio sample to a 10-bit PCM digital audio sample and uses noise shaping techniques to reduce the quantization noise inside the audio band, typically DC to 20 or 40 kHz. The modulator blocks perform the PCM to PWM conversion on the 10-bit digital audio. The output stages amplify the PWM waveforms generated by the modulator block, typically utilizing high voltage power supplies, high power field-effect transistors (FETs), and various other components. Passive LC filters are used to attenuate the PWM switching signal and are connected to the load, typically a speaker, in a full-bridge configuration.

Figure 2:
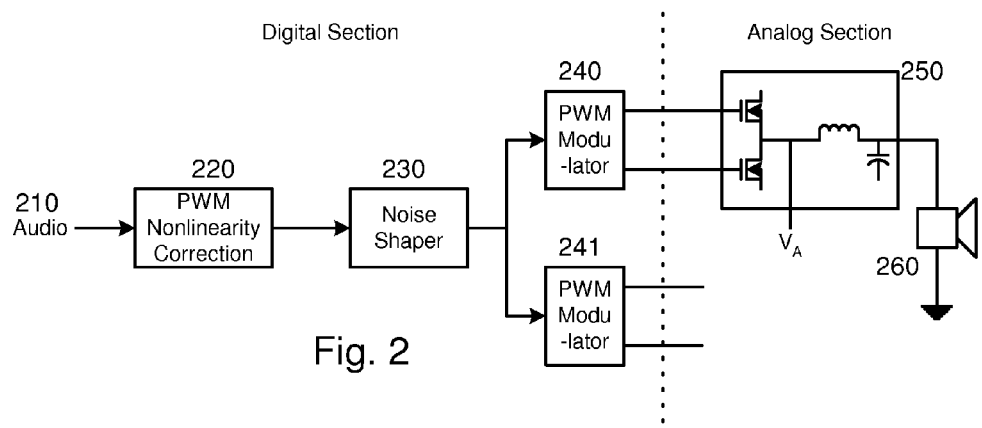
FIG. 2 is a functional block diagram illustrating a digital PWM amplification system using a half-bridge output stage topology.

It is also possible to create a digital PWM amplifier using a half-bridge output stage, as illustrated in FIG. 2. As in FIG. 1, this system comprises a digital audio signal (210), a PWM nonlinearity correction (220), a noise shaper (230), modulators (240, 241), but only one output stage (250), and a load (260). The output stage logic associated with the second modulator (241) is removed and the load terminal is now connected to ground. Second modulator 241 is unused and may be removed as well.

Two-level modulation is typically used in low-cost switching amplifier systems. Two level modulation can be used in either full-bridge or half-bridge configurations without altering the non-linear correction or hardware implementation. Other modulation schemes like three-level modulation (class BD), cannot operate in half-bridge mode, preventing lower cost solutions. Three-level modulation schemes also suffer dead-time distortion artifacts at low signal levels.

Figure 3:
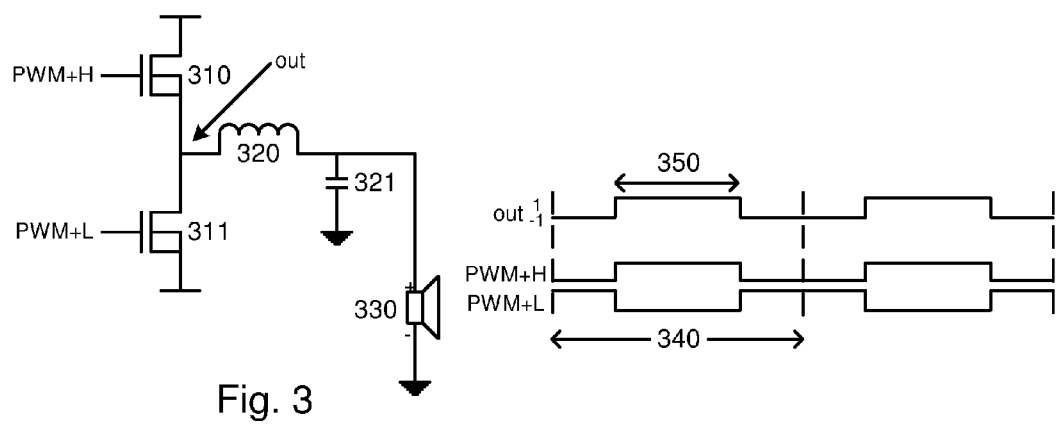
FIG. 3 is a diagram illustrating the block diagram and waveform for 2-level half-bridge modulation.

FIG. 3 illustrates a half-bridge output stage and two-level modulation. The timing diagram displays two switch periods. The PWM+H and PWM+L signals are generated by PWM modulators 140 and 240 previously shown in FIGS. 1 and 2. The power FETS (310, 311) are high voltage NMOS field effect transistors. The high side FET (310) is driven by the PWM+H signal and the low side FET (311) is driven by the PWM+L signal. The LC passive filter (320, 321) is used to attenuate the PWM switching signal at the load (330) and is connected to the positive terminal on the load, which is typically a speaker. The load's negative terminal is typically connected to ground in a half-bridge configuration. The timing diagram illustrates a typical modulation scheme. Over one switch period (340), the PWM+H and PWM+L are manipulated to produce a pulse width (350) that is proportional to the output signal being modulated.

Figure 4:
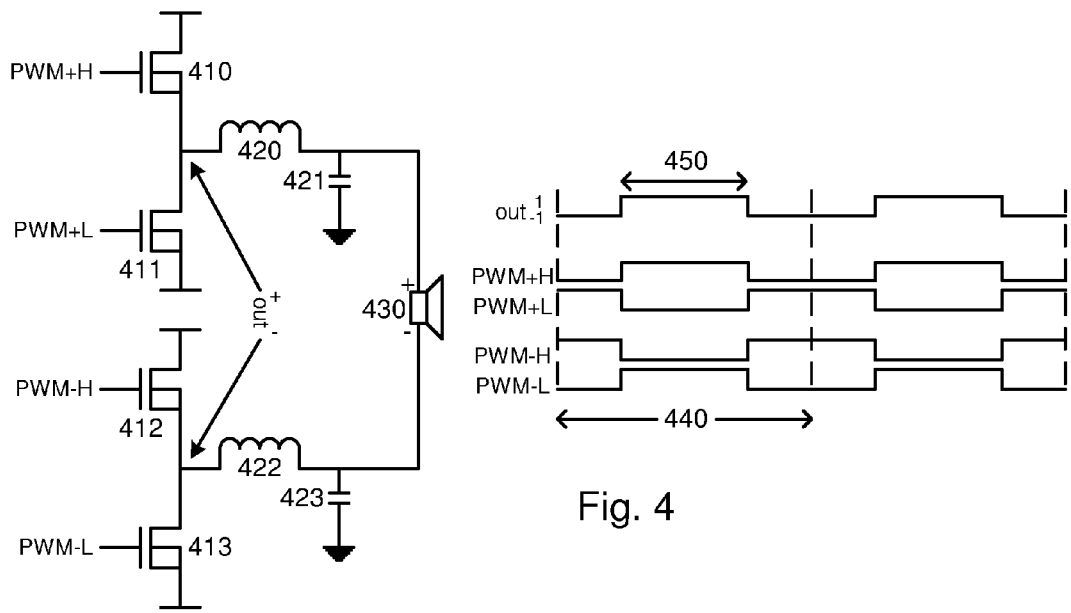
FIG. 4 is a diagram illustrating the block diagram and waveform for 2-level full-bridge modulation.

FIG. 4 illustrates a full-bridge output stage and two-level modulation. The timing diagram displays two switch periods. A full-bridge output stage is very similar to two combined half-bridge output stages. The PWM+H, PWM+L, PWM−H, and PWM−L signals are generated by the PWM modulators previously shown in FIGS. 1 and 2. The power FETS (410, 411, 412, 413) are high voltage NMOS field effect transistors. The positive bridge, high side FET (410) is driven by the PWM+H signal and the positive bridge, low side FET (411) is driven by the PWM+L signal. The negative bridge, high side FET (412) is driven by the PWM−H signal and the negative bridge, low side FET (413) is driven by the PWM−L signal. The PWM signal high state is interpreted as causing the coupled FET to conduct and the signal low state is interpreted as causing the coupled FET not to conduct. The PWM signals are show as being equal and opposite, although this may not always occur (the inclusion of techniques for correction of dead-time and shoot-through current, such as those described in U.S. Pat. No. 7,023,268 to Taylor et al., may modify the relative timing of the two PWM output signals.)

Two LC passive filters are used to attenuate the PWM switching signal, one (420, 421) for the positive bridge and one (422, 423) for the negative bridge. The output of the positive bridge LC filter is connected to the positive terminal on a load (430), which again is typically a speaker. The output of the negative bridge LC filter is connected to the negative terminal on the load. The timing diagram illustrates a typical modulation scheme. Over one switch period (440), the PWM+H, PWM+L, PWM−H, and PWM−L are each manipulated to produce a pulse width (450) that is proportional to the output signal being modulated.

The two-level nonlinearity correction is implemented assuming that the pulse width modulation output will be symmetric around the middle of a given switch period, resulting in reduced design complexity and a much lower implementation cost. The assumption of symmetric pulses, however, constrains the number of valid pulse widths that can be represented. For example, consider a digital amplifier system that has 16 discrete steps, or levels, per switch period where, for each step, the output can be either high or low. A 16 level system is a trivial case and modern implementations can contain up top 512 to 1024 levels per switch period, but 16 levels is useful for illustrative purposes. To create a pulse width which is symmetric around the middle of the switch period, only pulse widths of 0, 2, 4, 6, 8, 10, 12, 14, and 16 may be produced. Pulse widths of 1, 3, 5, 7, 9, 11, 13, and 15 result in asymmetric waveforms. The elimination of asymmetric pulse widths results in an approximately 6 dB increase in the noise floor of the output because approximately half the states are no longer available. It would therefore be desirable to recover the lost 6 dB of resolution by finding a way to represent signal levels corresponding to odd pulse widths (asymmetric signal levels) in this 16 level system.

Figure 5:
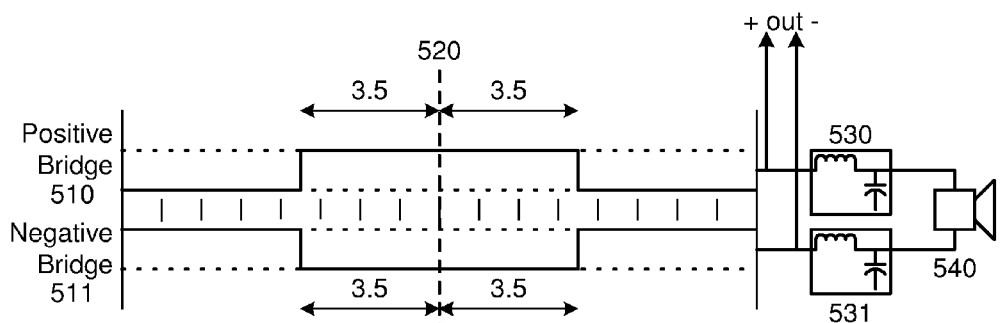
FIG. 5 is a diagram illustrating ideal two-level odd-pulse modulation behavior.
Figure 6:
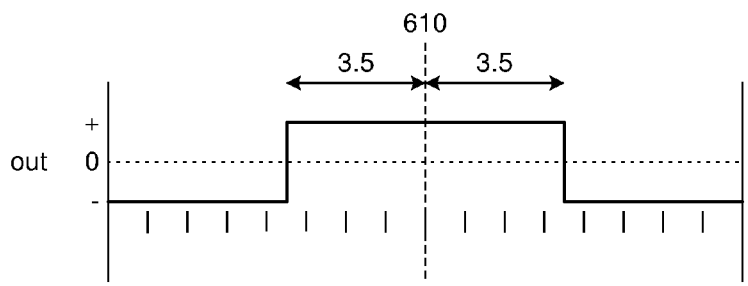
FIG. 6 is a diagram illustrating ideal two-level odd-pulse modulation voltage.

The ideal way to handle odd pulses is illustrated in FIG. 5. The two-level, full-bridge, and seven unit wide modulation waveform is distributed symmetrically around the middle of the switch period (520). As appropriate for two-level modulation, the positive bridge signal (510) is the inverse of the negative bridge terminal (511). (Unless noted otherwise, the pulse width of the positive bridge will be referred to as the time spent high and the pulse width of the negative bridge will be referred to as the time spent low for descriptive purposes.) This diagram includes the LC passive filters (530, 531) and load (540) for illustrative purposes. FIG. 6 illustrates the voltage as measured across "out" in FIG. 5 (i.e., between the output of the positive bridge and the output of the negative bridge.) Note that the waveform is again symmetric around the middle of the switch period (610). Also note that the average voltage of the switch period is $((7*1)+(9*-1))/16=-0.125$.

In practice, it is impossible to form odd pulse widths in this way. The waveforms illustrated in FIG. 5 require that the system have 32 steps, which is beyond the capabilities of the described system. Consequently, when confronted with odd pulse widths, two-level modulation based switching amplifiers typically produce pulses that are asymmetric around the middle of the switch period, instead of the symmetric pulses illustrated in FIGS. 4-6.

Figure 7:
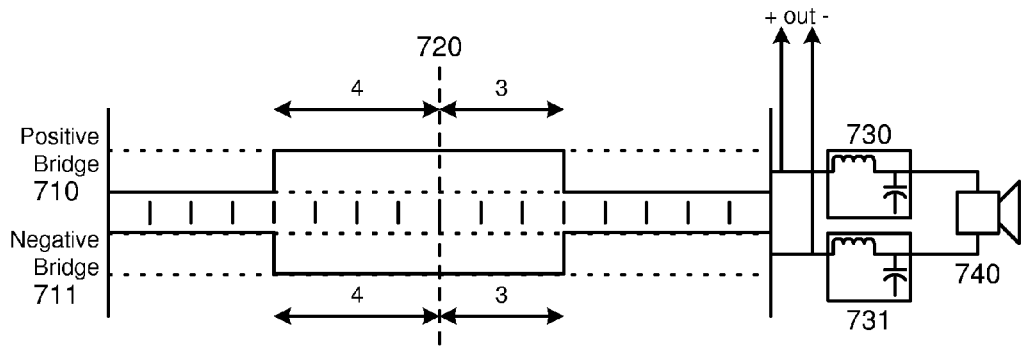
FIG. 7 is a diagram illustrating real-world two-level odd-pulse modulation behavior.
Figure 8:
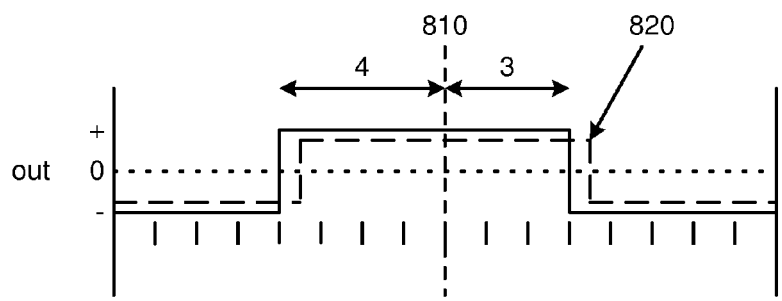
FIG. 8 is a diagram illustrating real-world two-level odd-pulse modulation voltage.

FIG. 7 illustrates the practical result of an odd-sized pulse being modulated using two-level modulation. The diagram assumes a 16-level PWM output and a positive pulse width of 7. The two-level, full-bridge, and seven unit wide modulation waveform is distributed asymmetrically around the middle of the switch period (720), with one side of the pulse, measured from the center of the pulse period, being one unit wider than the other side of the pulse. As appropriate for two-level modulation, the positive bridge signal (710) is the inverse of the negative bridge terminal (711). This diagram includes the LC passive filters (730, 731) and load (740) for illustrative purposes. FIG. 8 illustrates the voltage as measured across "out" in FIG. 7. Note that the waveform is asymmetric around the middle of the switch period (810). The ideal, symmetric voltage waveform (820) is also illustrated. (Although the ideal, symmetric voltage waveform has the same excursion from negative to positive as the asymmetric waveform, the depiction of the ideal waveform is offset for the purposes of clarity in the figure.) Note that the average voltage of the switch period is $((7*1)+(9*-1))/16=-0.125$, just as in FIG. 6.

As previously mentioned, if the nonlinear correction does not consider asymmetric pulses, the asymmetric modulation illustrated in FIG. 7 will result in increased distortion. The present systems and methods provide alternate ways of modulating signal levels that produce odd pulse width values in full-bridge configurations (which would produce asymmetric pulses in conventional two-level modulation schemes.)

Figure 9:
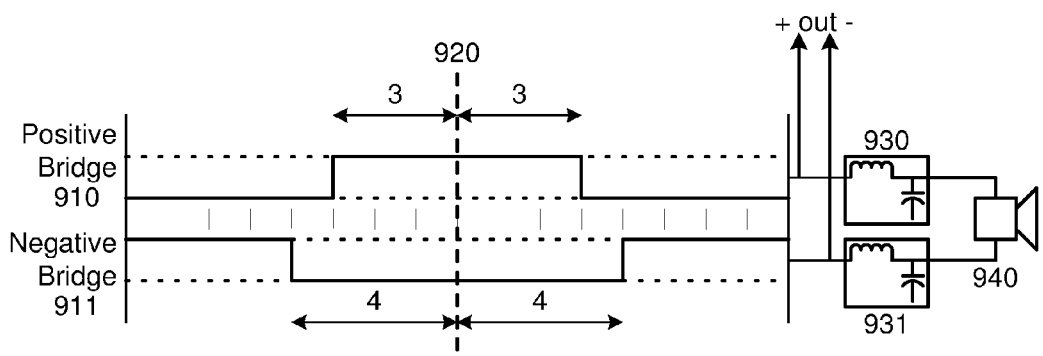
FIG. 9 is a diagram illustrating two-level odd-pulse modulation behavior in one embodiment.
Figure 10:
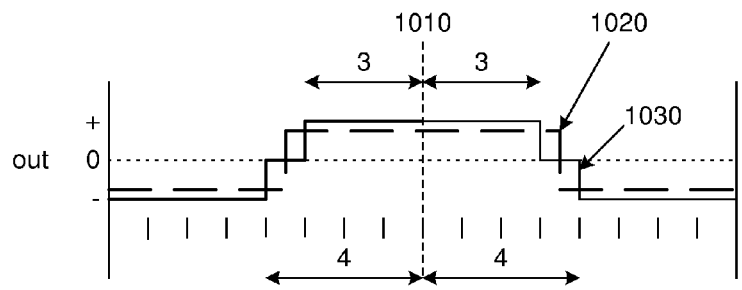
FIG. 10 is a diagram illustrating two-level odd-pulse modulation voltage in one embodiment.

FIG. 9 illustrates the waveforms output by the positive and negative bridges in one embodiment of the invention. Instead of producing two opposite and asymmetric waveforms having the same pulse width, the positive bridge (910) and negative bridge (911) produce waveforms in which the width of the pulse from the positive bridge is decreased by one and the width of the pulse from the negative bridge is increased by one. Thus, each pulse has an even width, so that both bridge waveforms can be symmetric around the middle of the switch period (920). This diagram includes the LC passive filters (930, 931) and load (940) for illustrative purposes. FIG. 10 illustrates the voltage as measured across "out" in FIG. 9. Note that the waveform (1030) is symmetric around the middle of the switch period (1010). The ideal, symmetric voltage waveform (1020) is also illustrated. Note that the average voltage of the switch period is ((6*1)+(8*-1)+(2*0))/16=-0.125, just as in FIG. 6.

Figure 11:
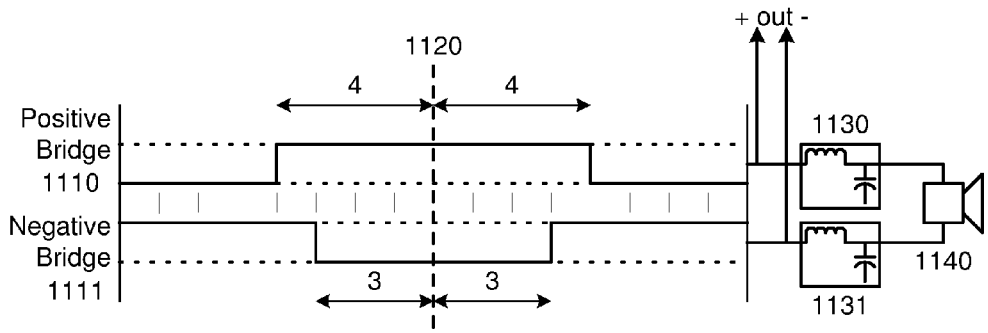
FIG. 11 is a diagram illustrating two-level odd-pulse modulation behavior in an alternative embodiment.

An alternative method of altering the modulation is shown in FIG. 11. In this example, the positive bridge (1110) pulse width is increased by one and the negative bridge (1111) pulse width is decreased by one. Again, this results in both bridge waveforms having even widths, so that they can be symmetric around the middle of the switch period (1120). This diagram includes the LC passive filters (1130, 1131) and load (1140) for illustrative purposes. This modulation produces the same voltage waveform across "out" (1030) as shown in FIG. 10.

Figure 12:
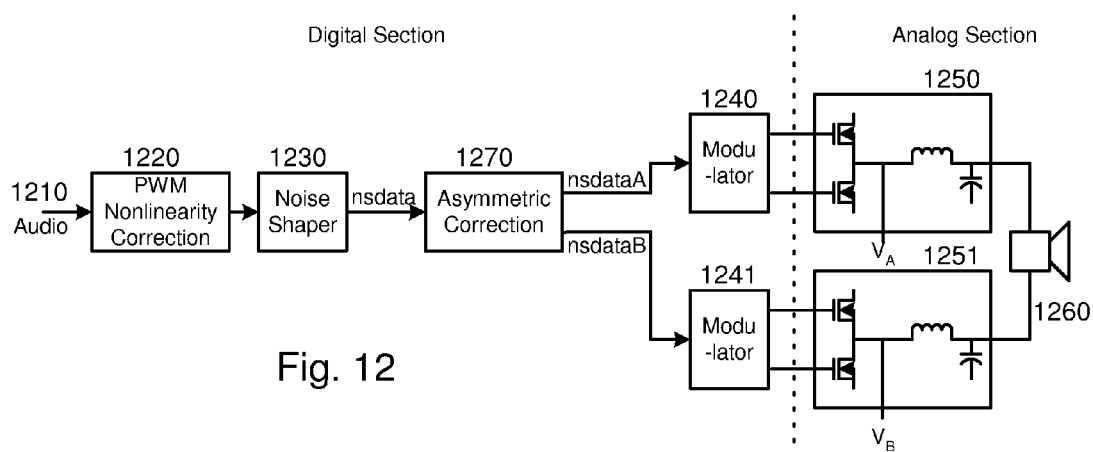
FIG. 12 is a diagram illustrating the structure of a system in accordance with one embodiment.

FIG. 12 is a block diagram illustrating the structure of an exemplary system in which one embodiment of the invention is implemented. The block diagram is very similar to FIG. 1 and includes a digital audio signal (1210), a PWM nonlinearity correction (1220), a noise shaper (1230), modulators (1240, 1241), output stages (1250, 1251), and a load (1260). The present system adds to this an asymmetric correction block (1270) that takes the output of the noise shaper, nsdata, and produces two different signals, nsdataA and nsdataB, to be modulated by the modulator blocks. The signal nsdataA is used to create the positive bridge waveform and signal nsdataB is used to create the negative bridge waveform. Signals nsdataA and nsdataB have two different signal levels and result in waveforms having two different pulse widths.

The following algorithm, expressed as Verilog, is used to create the nsdataA and nsdataB signals inside the asymmetric correction block. It assumes odd values (signal levels) of nsdata would be represented as asymmetric pulse widths in two-level modulation and thus requires the asymmetric correction block to correct the asymmetric pulse width.

```
if (nsdata[0] == 1'b1)
  begin
    nsdataA <= nsdata + offset;
    nsdataB <= nsdata - offset;
  end
else
  begin
    nsdataA <= nsdata;
    nsdataB <= nsdata;
  end
```

The offset can be initialized to a value of 1 or -1. A value of 1 will produce the example illustrated in FIG. 11. A value of -1 will produce the example illustrated in FIG. 9. Offset may also be varied by a number of algorithms, including alternating between -1 and 1 on every switch period or when an odd-pulse width is received by the asymmetric correction block. This would cause the wider (and narrower) pulse widths to be produced alternately in the waveforms of the positive and negative half-bridges. Should the offset be a larger odd number (i.e. 3/-3, 5/-5), the system will still function and asymmetric pulse widths will be rendered into two different symmetric pulse widths, but this is not preferable. The nonlinear correction is more accurate when each half-bridge pulse width is as close to ideal pulse width as practical. Creating a larger deviation in pulse width than necessary to implement the system will result in increased distortion. Also, a larger offset will decrease available modulation index at extreme pulse widths.

It should also be noted that while the preferred embodiment considers digital amplifier systems with an even number of levels per switch period, it is also possible to have systems with an odd number of levels per switch period. In such a case, even signal levels will result in asymmetric pulses. The asymmetric correction block in FIG. 12 would then provide its correction when the incoming signal level is even instead of odd. (Put another way, the even signal levels will be the asymmetric signal levels.)

Those of skill in the art will understand that information and signals may be represented using any of a variety of different technologies and techniques. For example, data, information, signals, bits, and the like that may be referenced throughout the above description may be represented by voltages, currents, electromagnetic waves, or the like, including combinations thereof. The information and signals may be communicated between components of the disclosed systems using any suitable transport media, including wires, metallic traces, and so on.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A pulse width modulation system comprising:
an asymmetric correction unit;
a first modulator coupled to the asymmetric correction unit;
a second modulator coupled to the asymmetric correction unit;
wherein the asymmetric correction unit is configured to receive samples of an input signal; and
wherein for each sample, the asymmetric correction unit is configured to
determine whether a signal level of each sample is one of a set of symmetric signal levels or one of a set of asymmetric signal levels,
when the signal level of the sample is one of the symmetric signal levels, forward the sample to each of the modulators, and
when the signal level of the sample is one of the asymmetric signal levels, forward a first modified sample to the first modulator and a second modified sample to the second modulator, wherein the signal level of one of the modified samples is increased by a selected amount to one of the symmetric signal levels and the signal level of the other of the modified samples is decreased by the selected amount to one of the symmetric signal levels.

2. The pulse width modulation system of claim 1, wherein ones of the modified samples that have increased signal levels are provided in an alternating fashion to the first modulator and to the second modulator.

3. The pulse width modulation system of claim 2, wherein the one of the first and second modulators to which the modified samples that have increased signal levels is alternated with each sample.

4. The pulse width modulation system of claim 2, wherein the one of the first and second modulators to which the modified samples that have increased signal levels are provided is alternated with each modified sample.

5. The pulse width modulation system of claim 1, wherein each of the first and second modulators is configured to generate a pair of pulse width modulated (PWM) output signals having identical symmetric pulse widths and wherein the pair of PWM output signals generated by the first modulator have a different width than the pair of PWM output signals generated by the second modulator.

6. The pulse width modulation system of claim 5, further comprising: a first half-bridge output stage configured to receive the pair of PWM output signals generated by the first modulator; and a second half-bridge output stage configured to receive the pair of PWM output signals generated by the second modulator.

7. The pulse width modulation system of claim 6, further comprising a load, wherein the first and second half-bridge output stages are configured as a full-bridge output stage, and wherein a first analog output of the first half-bridge output stage is applied to a positive side of the load and a second analog output of the second half-bridge output stage is applied to a negative side of the load.

8. The pulse width modulation system of claim 1, further comprising a noise shaper, wherein the noise shaper is configured to receive samples of a first digital signal and quantize and noise shape the samples of the first digital signal to produce the samples of the input signal.

9. The pulse width modulation system of claim 8, further comprising a pulse width modulation (PWM) non-linearity correction unit, wherein the PWM non-linearity correction unit is configured to receive a digital audio signal and to perform processing on the digital audio signal to correct for non-linear artifacts created by pulse code modulation (PCM)-to-PWM conversion to produce the first digital signal.

10. The pulse width modulation system of claim 1, wherein the pulse width modulation system is implemented in an audio amplifier.

11. A method comprising:
receiving samples of an input signal; and
for each sample,
determining whether a signal level of the sample is one of a set of symmetric signal levels or one of a set of asymmetric signal levels,
when the signal level of the sample is one of the symmetric signal levels, forwarding the sample to a first and second modulator, and
when the signal level of the sample is one of the asymmetric signal levels, increasing the signal level of a first modified sample by a selected amount to one of the symmetric signal levels, decreasing the signal level of a second modified sample by the selected amount to one of the symmetric signal levels, forwarding one of the modified samples to a first modulator and forwarding the other of the modified samples to a second modulator.

12. The method of claim 11, further comprising forwarding the ones of the modified samples that have increased signal levels in an alternating fashion to the first modulator and to the second modulator.

13. The method of claim 12, further comprising alternating with each sample the one of the first and second modulators to which the modified samples that have increased signal levels is forwarded.

14. The method of claim 12, further comprising alternating with each modified sample the one of the first and second modulators to which the modified samples that have increased signal levels is forwarded.

15. The method of claim 11, further comprising each of the first and second modulators generating a pair of pulse width modulated (PWM) output signals, wherein the PWM output signals within each pair have identical symmetric pulse widths, and wherein the pair of PWM output signals generated by the first modulator have a different width than the pair of PWM output signals generated by the second modulator.

16. The method of claim 15, further comprising forwarding the pair of PWM output signals generated by the first modulator to a first half-bridge output stage which generates a first analog output signal therefrom and forwarding the pair of PWM output signals generated by the second modulator to a second half-bridge output stage which generates a second analog output signal therefrom.

17. The method of claim 16, further comprising applying one of the first and second analog output signals to a positive side of the load and applying the other of the first and second analog output signals to a negative side of the load.

18. The method of claim 11, further comprising quantizing and noise shaping samples of a first digital signal to produce the samples of the input signal.

19. The method of claim 18, further comprising processing a digital audio signal to produce the first digital signal, wherein the processing comprises correcting for non-linear artifacts created by pulse code modulation (PCM)-to-PWM conversion.

20. The method of claim 19, wherein the method is implemented in an audio amplifier.

* * * * *